US006700514B2

(12) United States Patent
Soltanian et al.

(10) Patent No.: US 6,700,514 B2
(45) Date of Patent: Mar. 2, 2004

(54) FEED-FORWARD DC-OFFSET CANCELLER FOR DIRECT CONVERSION RECEIVER

(75) Inventors: Babak Soltanian, W. Windsor, NJ (US); Mohammad Madihian, Plainsboro, NJ (US)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 10/096,870

(22) Filed: Mar. 14, 2002

(65) Prior Publication Data

US 2003/0174079 A1 Sep. 18, 2003

(51) Int. Cl.$^7$ .............................. H03M 1/06; H03L 5/00
(52) U.S. Cl. ........................................ 341/118; 327/307
(58) Field of Search ................................. 341/118, 120, 341/155, 139; 327/307, 306; 329/343; 375/319; 455/234.1, 234.11, 239.1, 296

(56) References Cited

U.S. PATENT DOCUMENTS

| | | | |
|---|---|---|---|
| 4,902,979 A | * | 2/1990 | Puckette ...................... 329/343 |
| 5,724,653 A | * | 3/1998 | Baker et al. ................. 455/296 |
| 6,009,126 A | * | 12/1999 | Van Bezooijen ............ 375/319 |
| 6,275,087 B1 | * | 8/2001 | Dehghan .................... 327/306 |
| 6,314,278 B1 | * | 11/2001 | Zamat ....................... 455/239.1 |
| 6,317,064 B1 | | 11/2001 | Ferrer et al. |
| 6,321,073 B1 | * | 11/2001 | Luz et al. ................. 455/239.1 |
| 6,442,380 B1 | * | 8/2002 | Mohindra ............... 455/234.11 |
| 6,516,185 B1 | * | 2/2003 | MacNally ................. 455/234.1 |

OTHER PUBLICATIONS

Behzad Razavi, *Design Considerations for Direct–Conversion Receivers*, IEEE Transactions on Circuits and Systems–II: Analog and Digital Signal Processing, vol. 44, No. 6, Jun. 1997.
Won Namgoong, et al., *Direct–Conversion RF Receiver Design*, IEEE Transaction s on Communications, vol. 49, No. 3, Mar. 2001.
Asad A. Abidi, *Direct–Conversion Radio Transceivers for Digital Communications*, IEEE Journal of Solid–State Circuits, vol. 30, No. 12, Dec. 1995.

* cited by examiner

*Primary Examiner*—Patrick Wamsley
(74) *Attorney, Agent, or Firm*—Sughrue Mion, PLLC

(57) ABSTRACT

A feed-forward dc-offset canceller, for use in direct conversion receiver (DCR) architecture wireless systems, in which dc-offset is estimated from the down-converted signal at the mixer output, and the offset is cancelled before applying the signal to the analog baseband section. A linear digital filter estimates and tracks the dc-offset, which is subtracted from the down-converted signal before the analog baseband input. The response of the filter can be adjusted by its coefficients according to different environments and standard requirements. Although higher order filters can be used depending on the requirements, preferably, a first order recursive filter is used as it has the advantages of being a very simple and efficient structure.

63 Claims, 19 Drawing Sheets

FEED-FORWARD DC-OFFSET CANCELLER FOR DIRECT CONVERSION RECEIVER

BACKGROUND OF THE INVENTION

1. Field of the Invention

The invention relates to a feed-forward structure, as compared to a feed-back structure, for canceling the dc-offset of a down-converted RF signal in a Direct Conversion Receiver (DCR).

2. Description of the Related Art

For the purpose of indicating the background of the invention and/or the state of the art, the following four references are incorporated by reference in their entirety: B. Razavi, "Design Considerations for Direct-Conversion Receivers," *IEEE Transactions on Circuits and Systems*, vol 44, No. 6, June 1997 (herein "Reference 1"); W. Namgoong, "Direct-Conversion RF Receiver Design", *IEEE Transactions on Communications*, vol. 0.49, No. 3, March 2001 (herein "Reference 2"); A. Abidi, "Direct-Conversion Radio Transceivers for Digital Communications", *IEEE Journal of Solid-State Circuits*, vol. 30, No. 12, December 1995 (herein "Reference 3"); and U.S. Pat. No. 6,317,064 to Ferrer, et al., "DC offset correction adaptable to multiple requirements," published Nov. 13, 2001 (herein "Reference 4").

Wireless systems have become an essential part of modern life. Systems such as cell phones, wireless LANs, etc., are very popular and the penetration rate of these technologies is increasing very fast throughout the world. In view of high demand and marketplace competition, emphasis is placed upon new systems having small size, low power consumption, low cost, and of course, high bandwidth and quality service.

One of the impediments to making wireless equipment less expensive, smaller, and lower power, is the difficulty of integrating the analog front-end. The heterodyne receiver is the most popular architecture for wireless systems' front-end. It has good selectivity and performance but suffers from bulky off-chip components that can not be integrated with current technologies.

An alternative solution is the direct conversion receiver (DCR), which has a very simple architecture and a potential for a fully integrated front-end, with low cost, small size, and low power consumption. Such features are particularly attractive for next generation wireless handsets and for software defined radio (SDR) systems.

However, DCR suffers from some serious problems like dc-offset, 1/f noise, I/Q mismatch, and even-order distortion. I/Q mismatch and even-order distortion can be made negligible with good circuit design techniques, but dc-offset and 1/f noise are generally more serious and challenging problems, dc offset being considered the most challenging problem in realization of DCR in commercial products. Strong dc-offset drives the baseband amplifiers to nonlinear mode, and for ideal amplifiers it saturates analog-to-digital converters (ADCs) (e.g., Reference 1).

A very low frequency and reasonably high offset voltage may appear at the output of the mixer in a DCR. This offset voltage dominates the signal strength by a factor of 50–100 times in amplitude and highly degrades the bit-error-rate probability if not removed. Unless unwanted offset is removed in the analog domain prior to sampling and before the baseband amplifiers, the offset saturates the baseband amplifiers and causes devastating non-linear distortion. Also in the case of ideal amplifiers, a very large dynamic range ADC is needed to resolve the signal from the dc-offset (e.g., References 1 and 2).

FIG. 1A demonstrates a conventional DCR in which dc-offset cancellation circuits 20 remove, in the analog domain, dc-offset from the down-converted signal prior to variable gain amplifiers (VGA) 7.

There are different sources that cause dc-offset in a DCR. The local oscillator (LO) 4 signal leaks to the radio frequency (RF) port and the mixer 3 down converts the leaked signal to baseband, i.e., a zero intermediate frequency (IF). The LO signal also leaks from antenna 1 and reflects off external objects and self-down converts to direct current. These self-mixings introduce tremendous dc-offset because the LO signal is generally much stronger than RF signal. In addition, a strong interferer may leak to the LO port of the mixer and be translated to zero IF. The amount of dc-offset is difficult to predict because its magnitude changes with receiver location, orientation, and time. Therefore in addition to dc-offset estimation, a tracking method should be incorporated in the receiver to follow the offset variations (e.g., References 2 and 3).

A simple and straightforward method to cancel dc-offset is ac-coupling, as demonstrated in FIG. 1B. This method is suitable and cost effective where the signal spectrum does not have so much energy at dc and the ac-coupling does not degrade system performance. A pager is a good example for this case. Additionally, for Code Division Muliple Access (CDMA) systems, especially Wideband CDMA, some degradation in the spectrum is affordable and ac-coupling may be a viable solution. However, for CDMA, the corner frequency must be in the range of few kHz, requiring large off-chip capacitors, slowing response time, which is not desirable. None of these drawbacks are favorable in making a fully integrated front-end for sophisticated wireless systems.

Another approach to canceling dc-offset utilizes digital, rather than analog, techniques. Most digital methods for dc-offset cancellation are feedback-based average-and-subtract techniques. They estimate the offset noise by averaging the digitized signal after the entire analog baseband section. Then the estimated dc-offset value fed back and subtracted from the down-converted signal at the mixer output via adder 11.

An example of this technique is illustrated in FIG. 2. The signal is sampled after the ADC 9, but before the digital baseband receiver 10. The sampled signal is digitally processed by a dc-offset cancellation circuit 30 containing an averaging circuit 31, memory 32, and a digital-to-analog converter (DAC) 33. The dc-offset cancellation circuit 30 estimates the offset noise, which is then subtracted from the down-converted signal at adder 11.

Different methods have been proposed for estimating dc-offset, but nearly all of them share some drawbacks, such as (1) slow response due to their feedback structure, (2) saturation of the ADC and baseband amplifiers due to passing offset noise through the entire analog baseband section during detection time, (3) need for high resolution ADCs, (4) high complexity and computationally inefficiency, and (5) inefficient dc-offset tracking methods.

SUMMARY OF THE INVENTION

To overcome the drawbacks of the prior art, a new feed-forward dc-offset structure and method is proposed. The new canceller comprises a feed-forward structure where dc-offset, including offset noise, is estimated from down-converted signal, and cancelled before applying the signal to the analog baseband section. DC-offset is cancelled without using feedback.

A direct conversion receiver, according to an exemplary embodiment of the present invention, comprises a dc-offset tracking unit, a subtraction circuit, and an analog baseband circuit. The dc-offset tracking unit samples a down-converted signal, and outputs a dc-offset signal based upon the dc-offset of the sampled signal. The dc-offset tracking unit comprises a linear digital filter, estimating and tracking dc-offset in the sampled down-converted signal. The subtraction circuit receives the down-converted signal after the down-converted signal is sampled by the dc-offset tracking unit, and subtracts the dc-offset signal from the received down-converted signal. The analog baseband circuit comprises a variable gain amplifier, and receives the down-converted signal after the dc-offset has been subtracted.

Preferably, the linear digital filter is a first order recursive filter, having a transfer function:

$$y[n] = x[n] + ky[n-1]$$

$$y[n] - ky[n-1] = x[n]$$

$$H(z) = \frac{Y(z)}{X(z)} = \frac{1}{1 - kz^{-1}}$$

k being a loop gain of the first order recursive filter.

The direct conversion receiver further includes a mixer, an analog-to-digital converter, a low pass filter, and a digital baseband receiver. The mixer receives an RF signal and down-converts it to zero IF, outputting a down-converted signal. The analog-to-digital converter receives the down-converted signal after the dc-offset is subtracted by the subtraction circuit and after the gain of the signal is adjusted by the analog baseband circuit, converting the down-converted signal from analog into digital, for processing by the digital baseband receiver. The low pass filter filters the down-converted signal after the down-converted signal is output by the mixer, but before the signal is converted to digital by said analog-to-digital converter.

The dc-offset tracking unit further comprises an ADC and a DAC. The ADC samples the down-converted signal, and the DAC outputs the dc-offset signal, the linear digital filter being connected in the digital domain between the ADC and DAC. Instead of a DAC, a digitally programmable dc-voltage source can be used.

The dc-offset tracking unit further comprises a sampling rate converter, connected between said linear digital filter and the DAC.

The DCR further comprises an anti-aliasing filter, filtering the sampled signal prior to the signal being input into the ADC of the dc-offset tracking unit.

The invention further comprises a method of canceling dc-offset from a signal. An exemplary embodiment comprises monitoring a signal, detecting the dc-offset in the monitored signal by applying a linear filtering function, and subtracting the detected dc-offset from the signal at a point after where the signal was monitored.

The method preferably comprises using a first order recursive function as the linear filtering function, the first order recursive function having a transfer function of:

$$y[n] = x[n] + ky[n-1]$$

$$y[n] - ky[n-1] = x[n]$$

-continued
$$H(z) = \frac{Y(z)}{X(z)} = \frac{1}{1 - kz^{-1}}$$

k being a loop gain of the first order recursive function.

The invention further comprises a method operating a direct conversion receiver. An exemplary embodiment comprises receiving an RF signal, down-converting the RF signal to zero IF by mixing the RF signal with a signal from a local oscillator, canceling a dc-offset in the down-converted signal, adjusting gain of the down-converted signal after the dc-offset is cancelled, converting the gain-adjusted signal from analog to digital, low pass filtering the down-converted signal, and processing the digitally-converted signal. Canceling the dc-offset in the down-converted signal comprises monitoring the down-converted signal, detecting the dc-offset in the monitored signal by applying a linear filtering function, and subtracting the detected dc-offset from the down-converted signal at a point in the direct conversion receiver after where the down-converted signal was monitored. Low pass filtering is performed after the RF signal is down-converted, but before the gain-adjusted signal is converted from analog to digital.

Preferably, the linear filtering function is a first order recursive function, having a transfer function of:

$$y[n] = x[n] + ky[n-1]$$

$$y[n] - ky[n-1] = x[n]$$

$$H(z) = \frac{Y(z)}{X(z)} = \frac{1}{1 - kz^{-1}}$$

k being a loop gain of the first order recursive function.

Detecting the dc-offset further comprises converting the monitored signal from analog to digital before applying the linear filtering function, and converting the dc-offset detected by the linear filtering function from digital to analog.

The method further comprises anti-alias filtering the monitored signal prior to detecting the dc-offset.

Converting the dc-offset from digital to analog further comprises adjusting a digital sampling rate.

These structures and methods have very low complexity and are computationally efficient and accurate, and are very suitable for making low cost, small size, and low power consumption integrated RF receivers based on DCR.

The feed-forward design has many advantages over conventional designs, such as fast response time, more relaxed requirements on the analog baseband section, no need for high-resolution A/D converters to digitize a desired signal, negligible low frequency spectrum distortion that occurs in some of the wireless standards, very good tracking capability, easy configuration for different operating situations, suitability for multimode/multi-standard systems, no need for memory cells to store sample signals, and computational efficiency and less complexity because of the ability to operate at lower sampling rates and lower resolution.

Figure 1A:
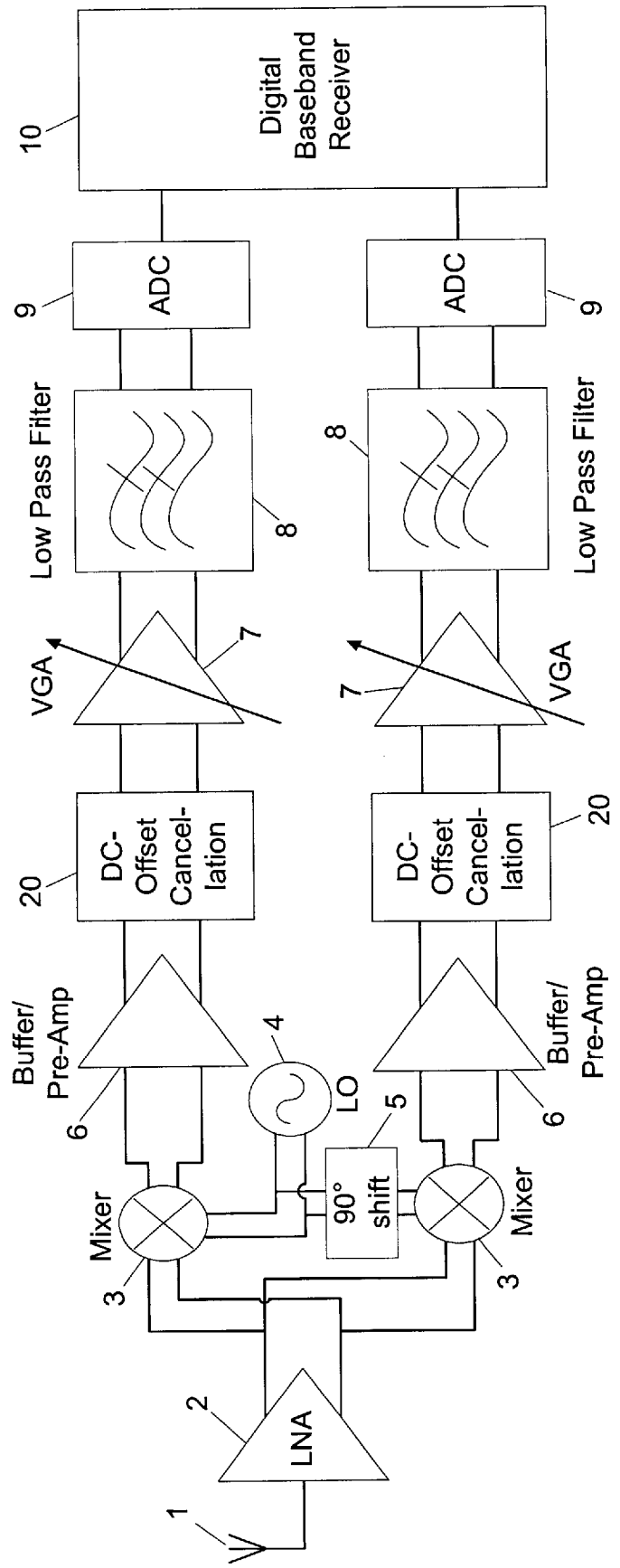
FIG. 1A illustrates a conventional DCR architecture employing dc-offset cancellation circuits to cancel the dc-offset in the analog domain.
Figure 1B:
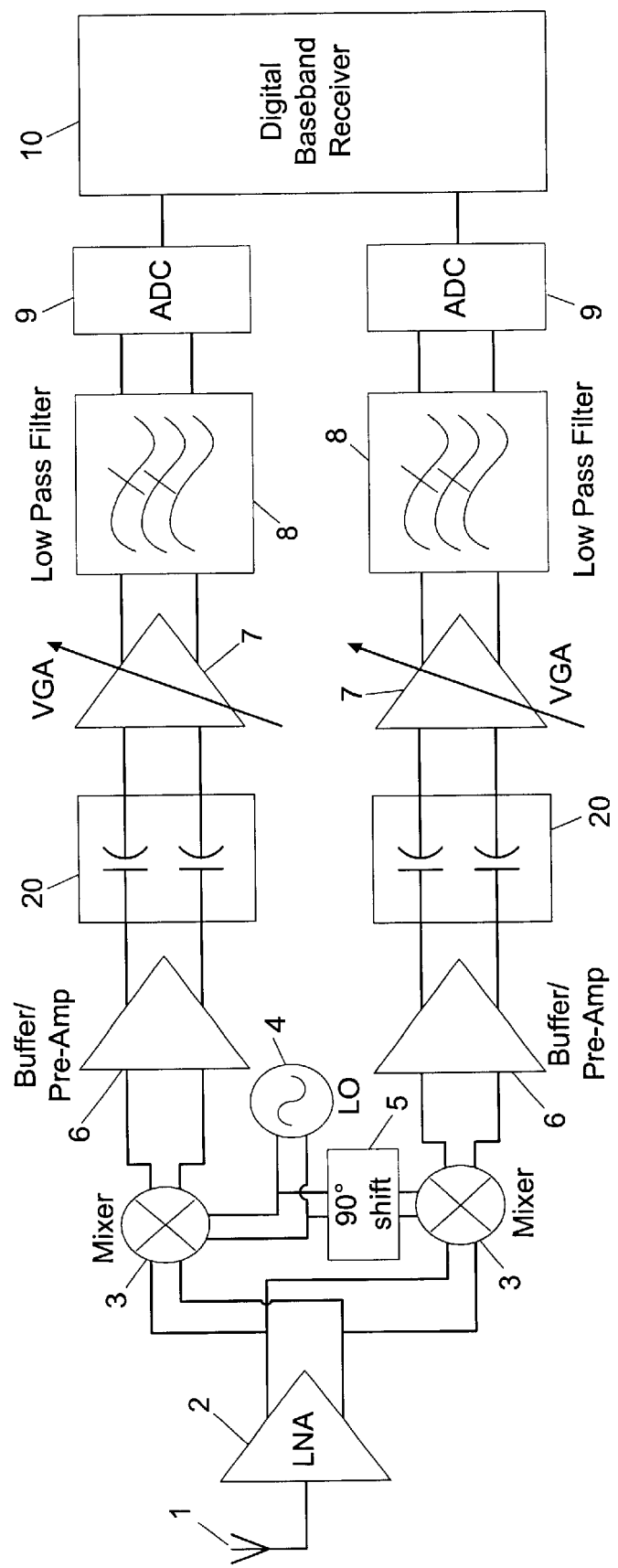
FIG. 1B illustrates a conventional DCR architecture in which the dc-offset cancellation circuits employ ac-coupling to cancel dc-offset.
Figure 2:
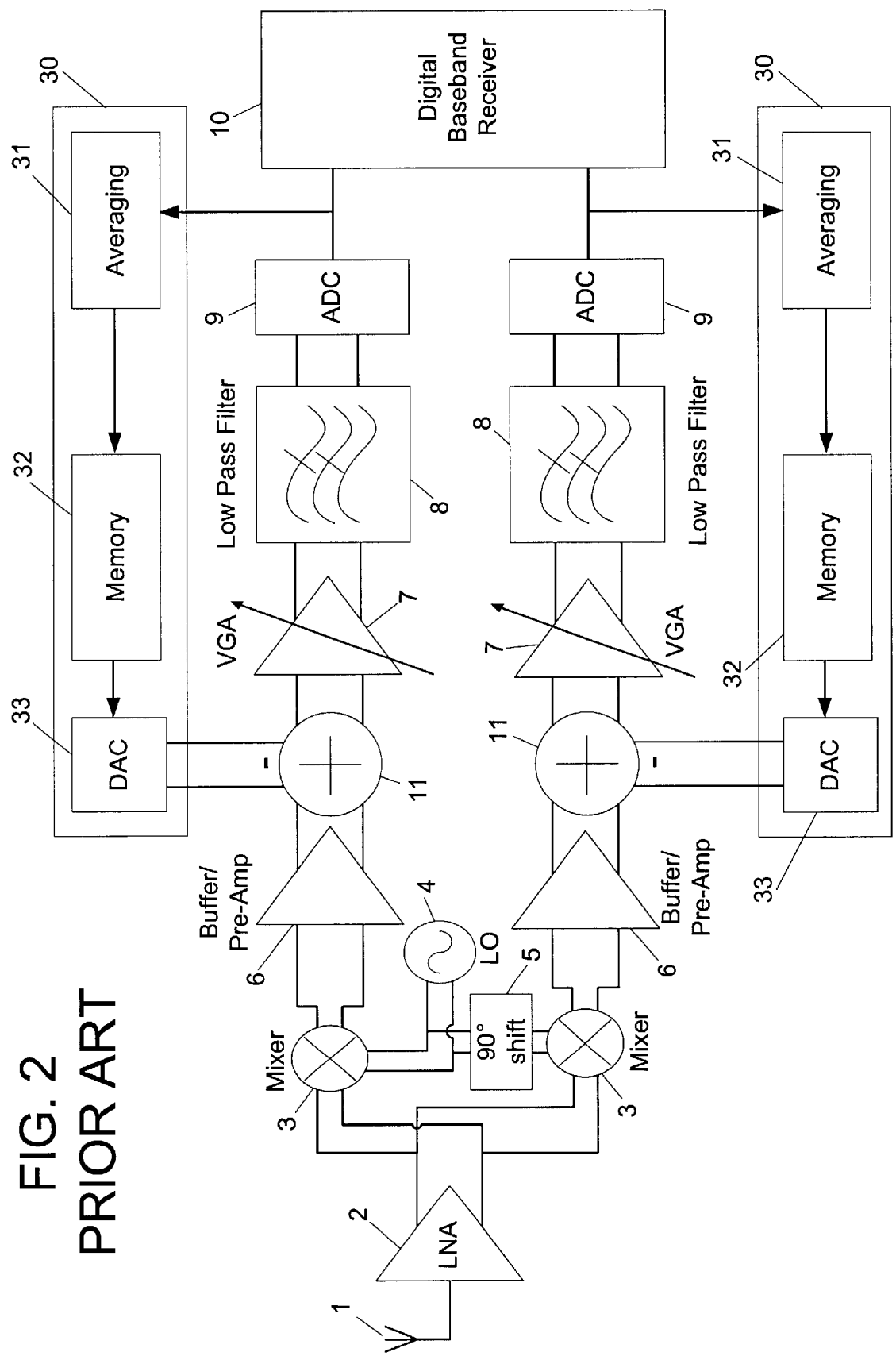
FIG. 2 illustrates a conventional DCR architecture employing feedback-based digital averaging and subtracting techniques to cancel dc-offset.

In the figures, common elements characteristic of DCRs are illustrated using reference numbers 1–10. These elements include antenna 1, low-noise amplifier (LNA) 2, mixers 3, local oscillator (LO) 4, a 90-degree phase shift circuit 5, buffer/pre-amplifiers 6, variable gain amplifiers (VGA) 7, low pass filters 8, analog-to-digital converters (ADCs) 9, and digital baseband receiver 10. As the function and purpose of these common elements of a DCR are well established in the art, for the purpose of brevity, detailed discussion of these elements has been omitted.

Additionally, differential signaling is often used in DCRs. In the figures, this is illustrated by a pair of signal lines representing the differential signal, such that one line of the pair is 180-degrees different in phase from the other. However, in several of the figures, for the purpose of simplicity, the differential signal is illustrated by a single signal line.

Use of differential signaling or non-differential signaling is a design choice based on considerations beyond the scope of the present disclosure. Differential signaling was chosen for the figures merely as an example, and the designs illustrated in the figures are equally applicable to non-differential circuits.

DETAILED DESCRIPTION OF THE PREFERRED EMBODIMENTS

Figure 3:
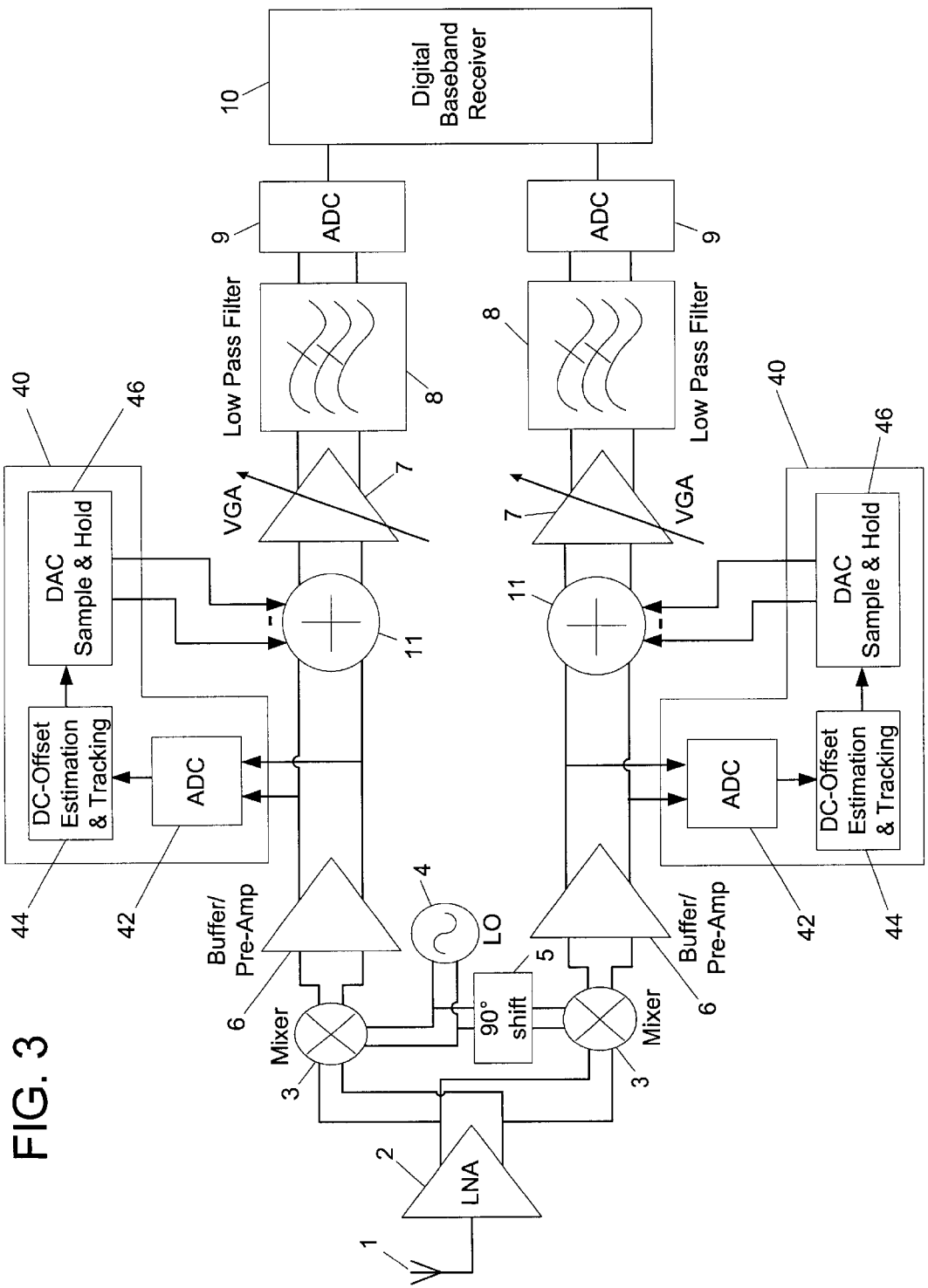
FIG. 3 illustrates a DCR architecture of an exemplary embodiment of the invention employing a feed-forward dc-offset canceller to cancel dc-offset.
Figure 4:
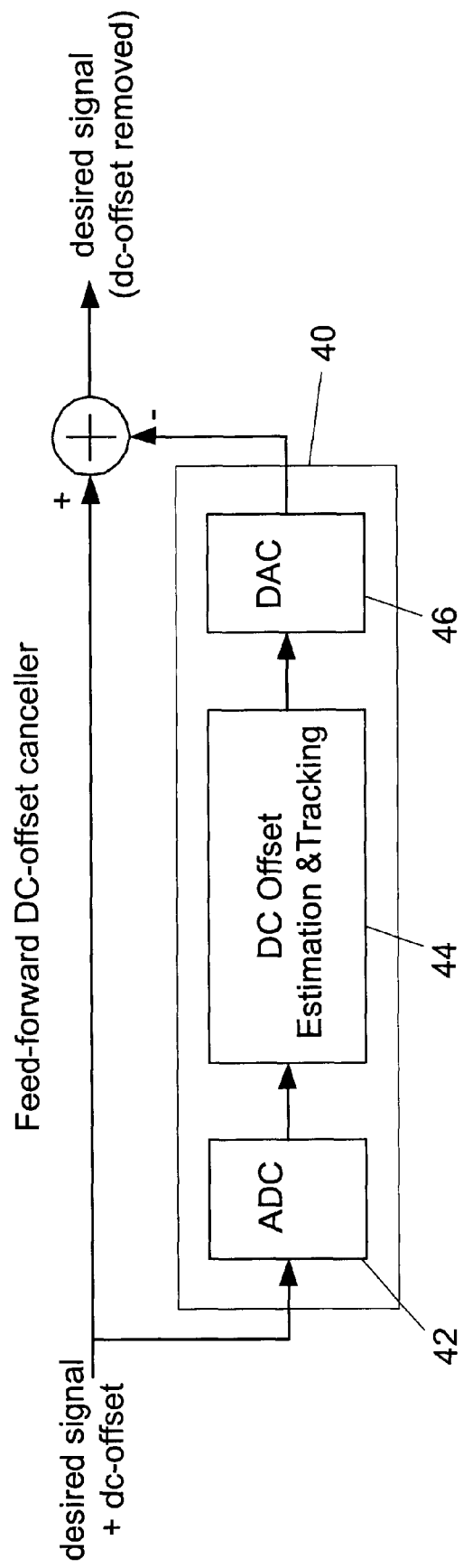
FIG. 4 is a block diagram of the feed-forward dc-offset canceller.

FIG. 3 shows a block diagram of a DCR with a feed-forward dc-offset canceller of a first embodiment. The down-converted signal, which conveys a weak signal corrupted with a strong dc-offset, goes through a feed-forward structure and is corrected prior to going to the analog baseband section.

The feed-forward dc-offset canceller includes an analog to digital converter 42, a dc-offset estimation and tracking block 44, and a digital to analog converter (DAC) 46. The down converted signal is monitored by sampling with a low resolution ADC 42 and the signal samples are fed to the dc-offset estimation and tracking block 44. DC-offset estimation and tracking is the heart of the offset cancellation method, and it is important to perform this task quickly and efficiently, preferably with a simple and low complexity method. After estimating, the dc-offset is converted to an analog signal and subtracted from the down-converted signal at the input of the analog baseband section.

Different techniques can be used to estimate and track dc-offset. A linear digital filter, such as an Infinite Impulse Response (IIR) filter or a Finite Impulse Response (FIR), is a fast and efficient method to estimate dc-offset value of the down-converted signal.

Accordingly, in the exemplary embodiments, the dc-offset estimation and tracking block 44 comprises a linear digital filter. The filter coefficients can be fixed or adjusted adaptively, depending on the mode of operation. The following equations show transfer function of a linear N-order digital filter, with at least one of the $a_N$ and $b_N$ coefficients not being equal to zero:

$$y[n] - \sum_{l=1}^{N} a_l y[n-l] = \sum_{l=0}^{N} b_l x[n-l]$$

$$H(z) = \frac{\sum_{l=0}^{N} b_l z^{-l}}{1 - \sum_{l=1}^{N} a_l z^{-l}}$$

By definition, for a FIR filter $a_l=0$, $l=1, \ldots, N$, whereas for an IIR filter, at least one $a_l$ is not zero, $l=1, \ldots, N$.

Figure 5A:
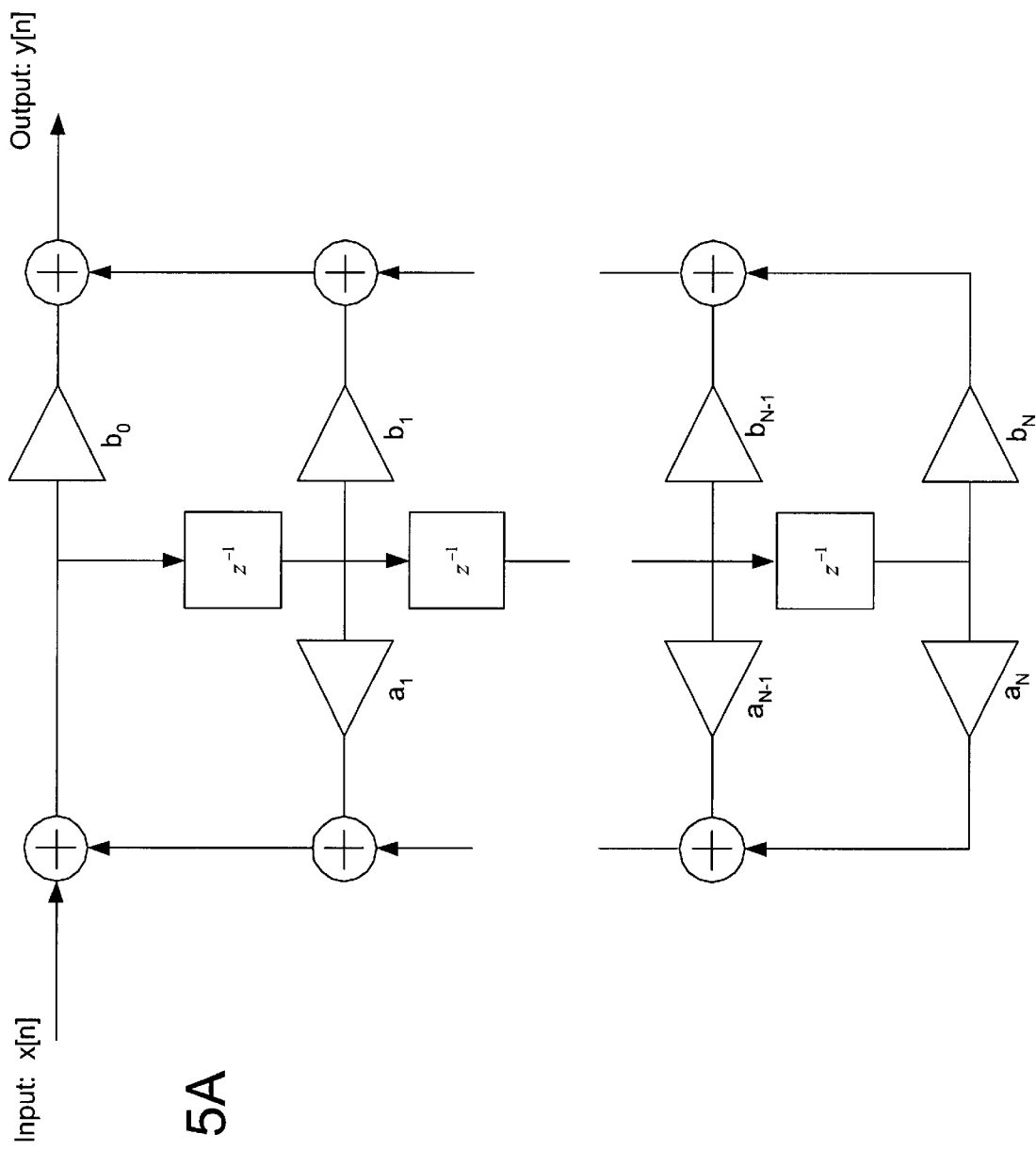
FIG. 5A is a block diagram of a linear digital filter for the dc-offset estimation and tracking in the feed-forward dc-offset canceller.

Such a filter is illustrated in FIG. 5A, which shows a general block diagram of an N-order linear digital filter.

Figure 5B:
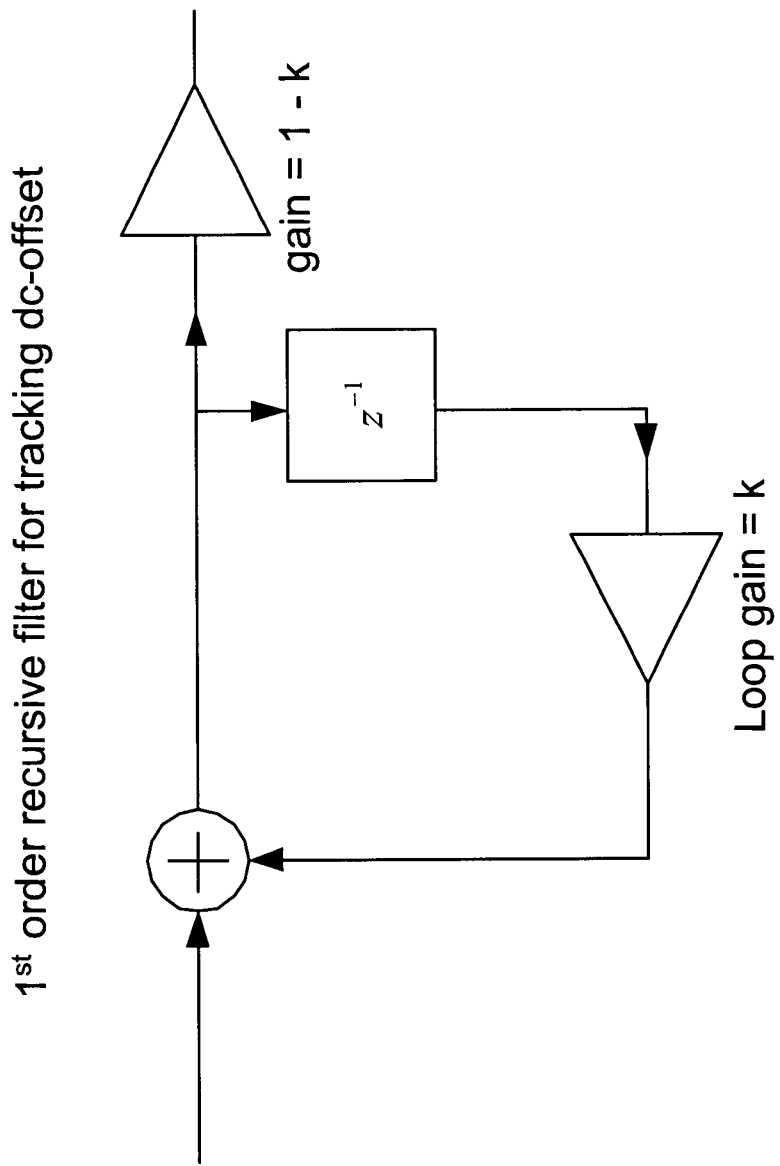
FIG. 5B is a block diagram of a first-order recursive filter for the dc-offset estimation and tracking unit in the feed-forward dc-offset canceller.

Although higher order filters can be used depending on requirements, preferably, a $1^{st}$-order recursive filter, as illustrated in FIG. 5B is used, as it has the advantages of being a very simple and efficient structure.

A $1^{st}$-order recursive filter has one zero at the origin and a pole at $z=k$ on the real axis and inside the unit circle. Depending on the loop gain (k), the place of the pole varies on the real axis. As long as the loop gain is real and less than 1, the pole is inside the unit circle and the system is stable. The following equations show transfer function of the $1^{st}$-order recursive filter:

$$y[n] = x[n] + ky[n-1]$$

$$y[n] - ky[n-1] = x[n]$$

$$H(z) = \frac{Y(z)}{X(z)} = \frac{1}{1 - kz^{-1}}$$

Figure 6A:
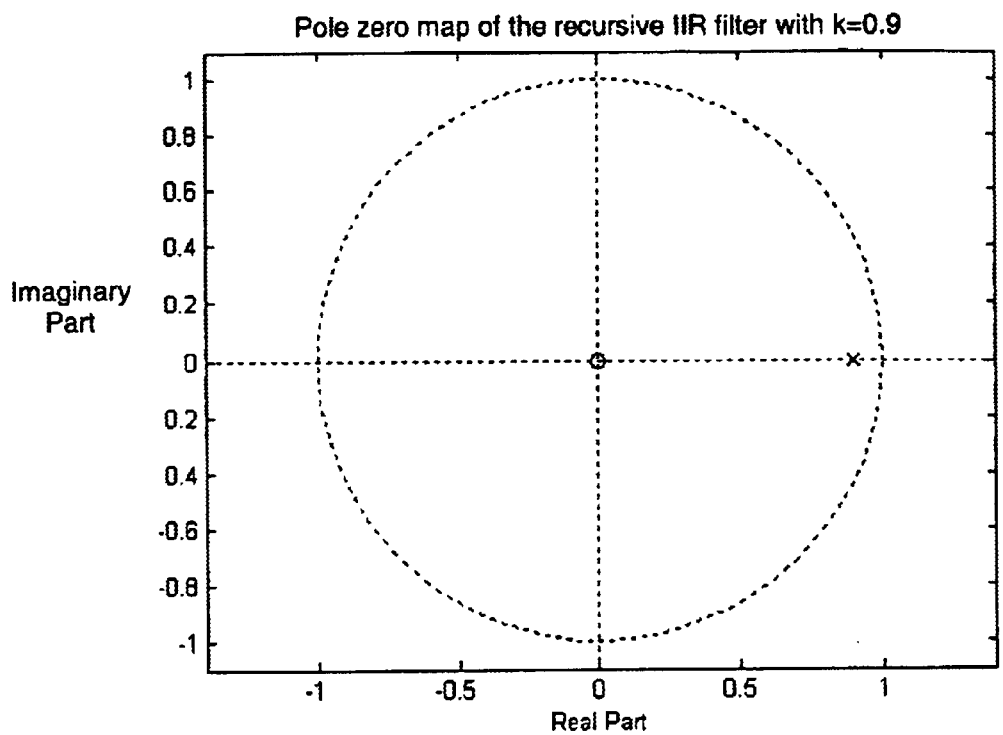
FIG. 6A illustrates the zero-pole loci of the first-order recursive filter of FIG. 5B for a loop gain of 0.9.
Figure 6B:
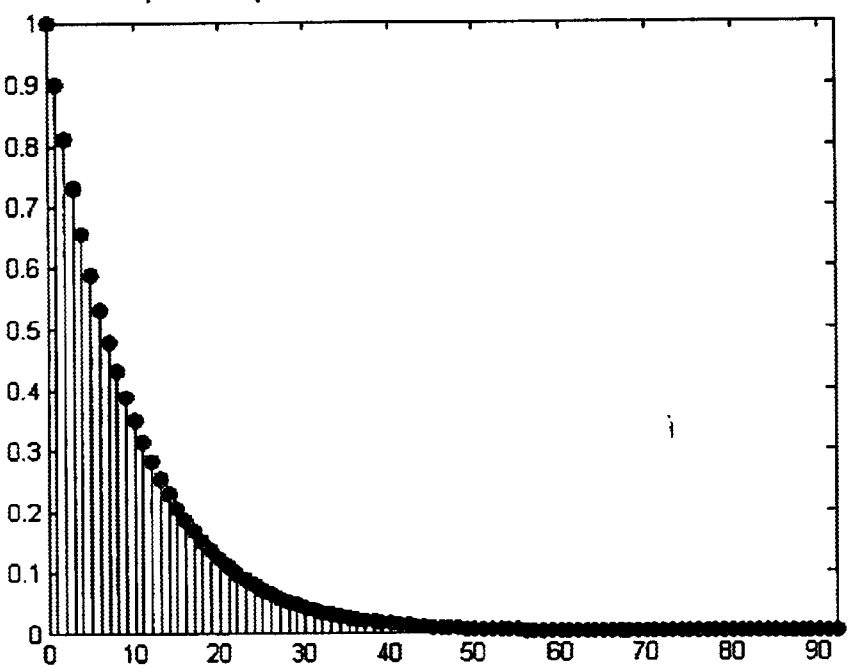
FIG. 6B illustrates the impulse response of the first-order recursive filter of FIG. 5B for a loop gain of 0.9.

The parameter k is a key factor that determines the response time of the filter. FIG. 6A shows the zero-pole loci, and FIG. 6B shows the impulse response, of the $1^{st}$-order filter for k=0.9. It is seen that the impulse response is almost settled after 15 samples. For a GSM system, where the dc-offset estimation should settle down within 400 μs (Reference 4), this translates into a sampling rate of less than 40 kHz, which is considered to be a low rate for currently available ADCs.

Figure 7A:
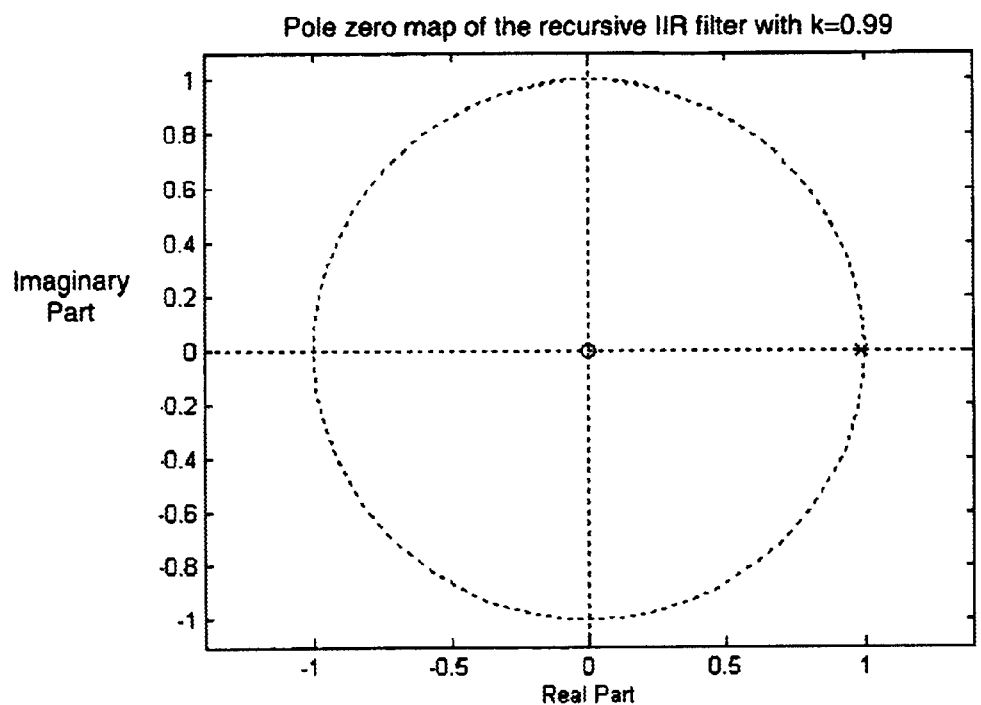
FIG. 7A illustrates the zero-pole loci of the first-order recursive filter of FIG. 5B for a loop gain of 0.99.
Figure 7B:
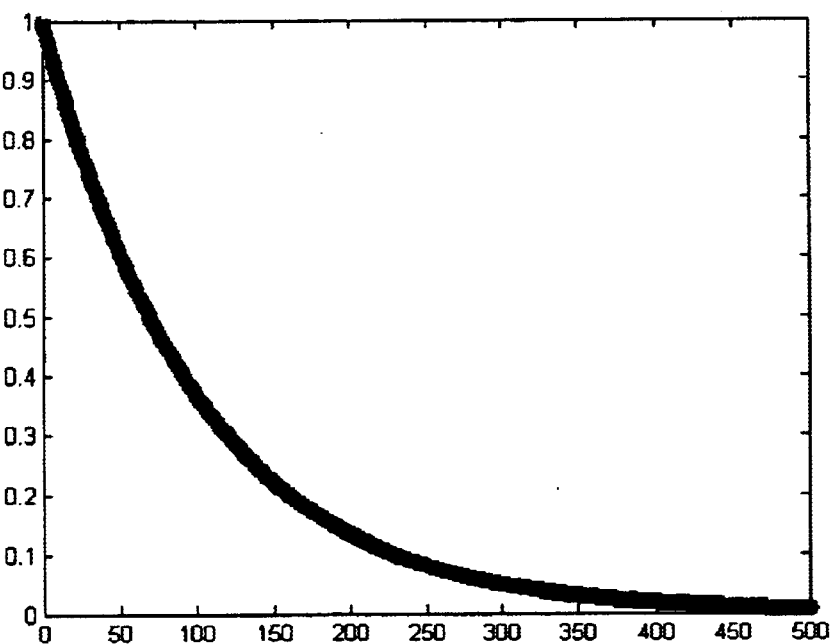
FIG. 7B illustrates the impulse response of the first-order recursive filter of FIG. 5B for a loop gain of 0.99.

FIG. 7A shows the zero-pole loci, and FIG. 7B shows the impulse response, of the $1^{st}$-order filter for k=0.99. In this case the settling time is much longer, and is about 400 samples. For the same settle time requirements, the sampling rate increases to 1 MHz, which is still not very high.

The variable settling time is an important characteristic of this filter, such that depending on the dc-offset variation and required settling time, the loop gain can be set to achieve system requirements for different environments and for different standards. Higher loop gains (e.g., k=0.99) increase settling time and accuracy of the offset estimate, while smaller values decrease the settling time (e.g., k=0.9).

One of the major advantages of this structure is its adaptability to dc-offset variations. In a DCR, dc-offset fluctuates with low frequency (comparing to the desired signal) and it is important to be able to track this fluctuations. The disclosed filter has the capability to track this variation of the dc-offset.

It should be noted that the recursive dc-offset tracking method can be used in feedback structures as well and is still superior to other averaging techniques, which are more complex and need more computation power and memory.

Low resolution ADCs can be used in the dc-offset tracking unit 40 because there is no need to resolve a weak received signal. It is necessary to only estimate the offset value, so an inexpensive, low-resolution ADC is an appropriate choice. For example, in a GSM system, the offset should settle down below 30 mV. By assuming a 3V supply voltage, an 8-bit ADC has a resolution of 11 mV, which is more than enough for this purpose.

This filter also does not need memory cells to store samples of the signal, as compared to other reported methods, so it is more cost effective and less complex.

Figure 8A:
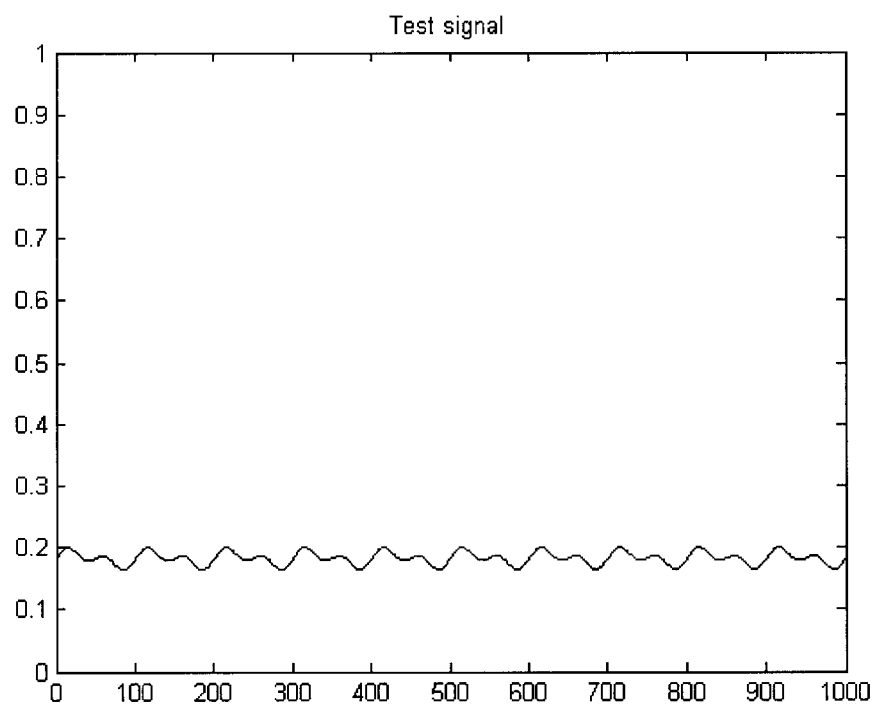
FIG. 8A illustrates a first test signal used to evaluate the functionality of the feed-forward dc-offset canceller, where the down-converted signal has a dc-offset and a weak ac-component.
Figure 8B:
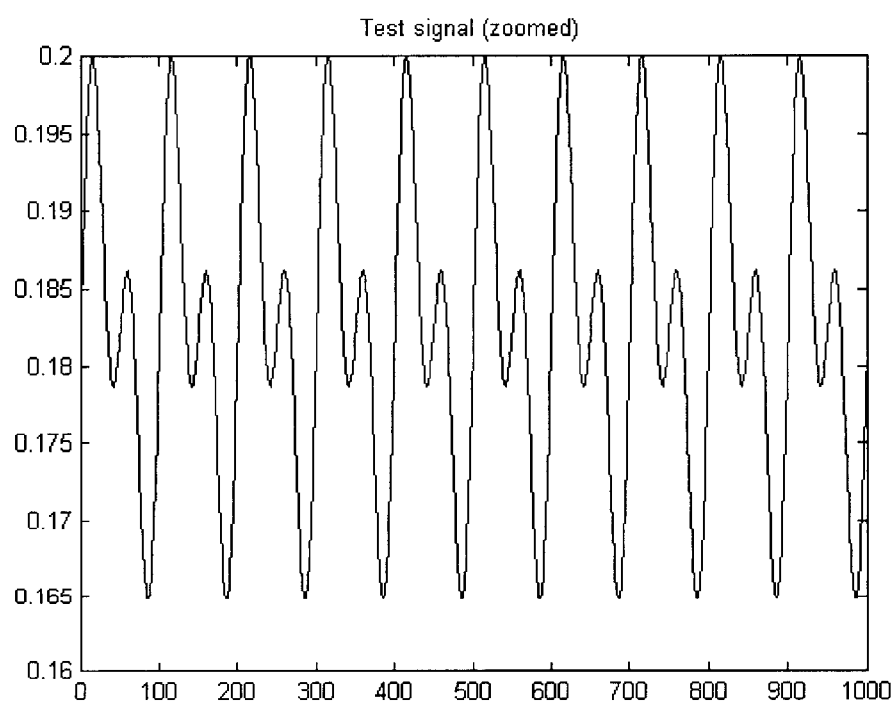
FIG. 8B illustrates the first test signal shown in FIG. 8A, with the voltage scale adjusted to magnify the down-converted signal.
Figure 9A:
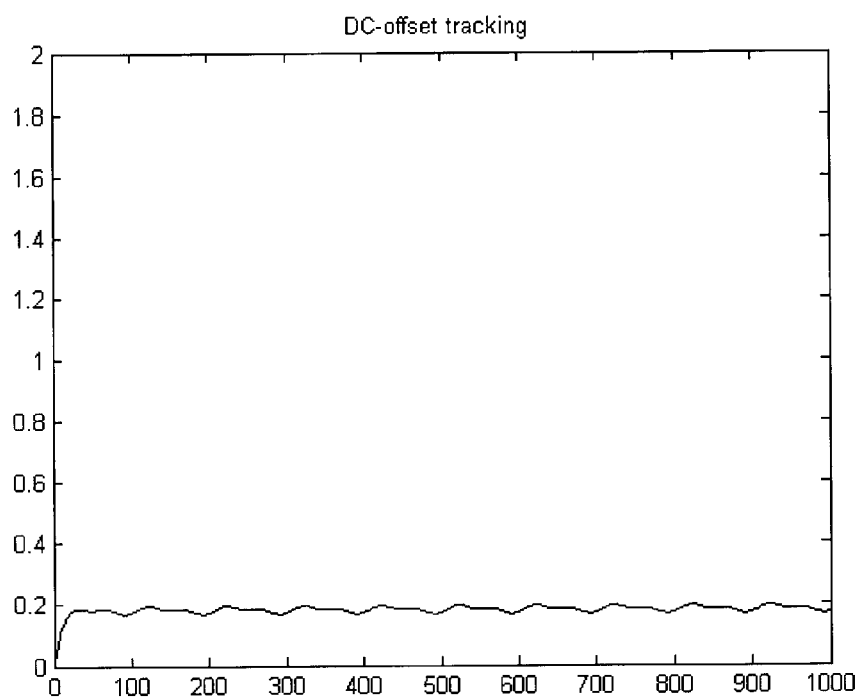
FIG. 9A illustrates the output of the dc-offset cancellation unit for a loop gain of 0.99, when the first test signal is fed into the feed-forward dc-offset canceller.
Figure 9B:
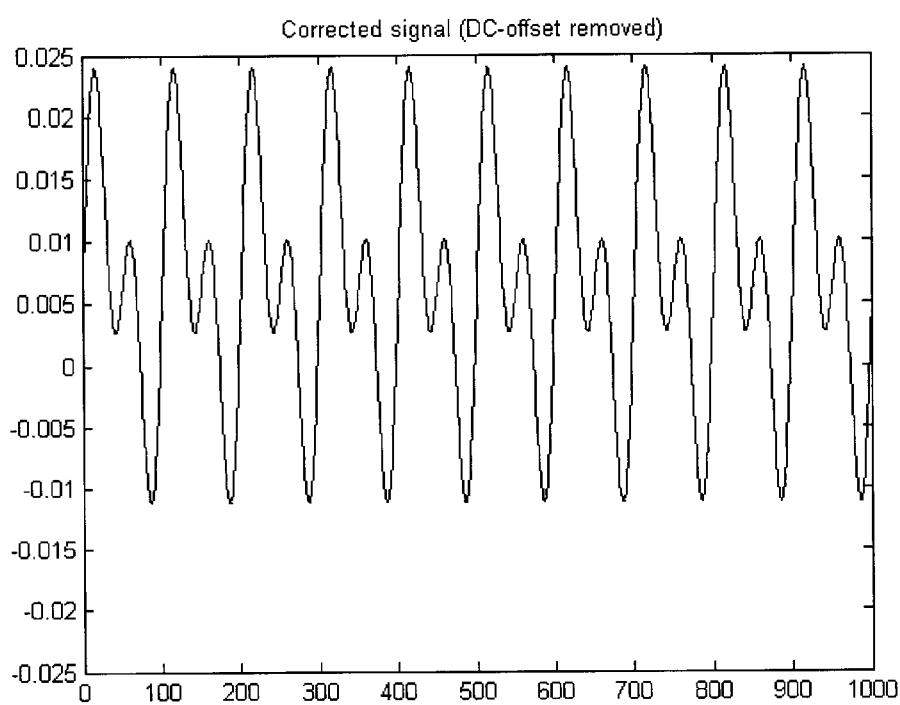
FIG. 9B illustrates the corrected signal at the input of the analog baseband section, applying the output of the dc-offset cancellation unit illustrated in FIG. 9A.

To evaluate the functionality of the feed-forward dc-offset cancellation method, test signals comprising weak ac-component and a weak dc-offset were applied to the input of the dc-offset tracking unit 40. FIGS. 8A and 8B show a test signal where the down-converted signal has a dc-value of 0.2V. The estimated value at the output of the dc-offset tracking unit 40 for loop gain=0.99 is shown in FIG. 9A, and FIG. 9B shows the corrected signal, after the output of the dc-offset tracking unit is subtracted from the test signal. The results for applying a test signal with stronger dc-offset (FIGS. 10A–B) are shown in FIGS. 11A–B and FIGS. 12A–B for loop gains equal to 0.99 and 0.9 respectively.

Figure 10A:
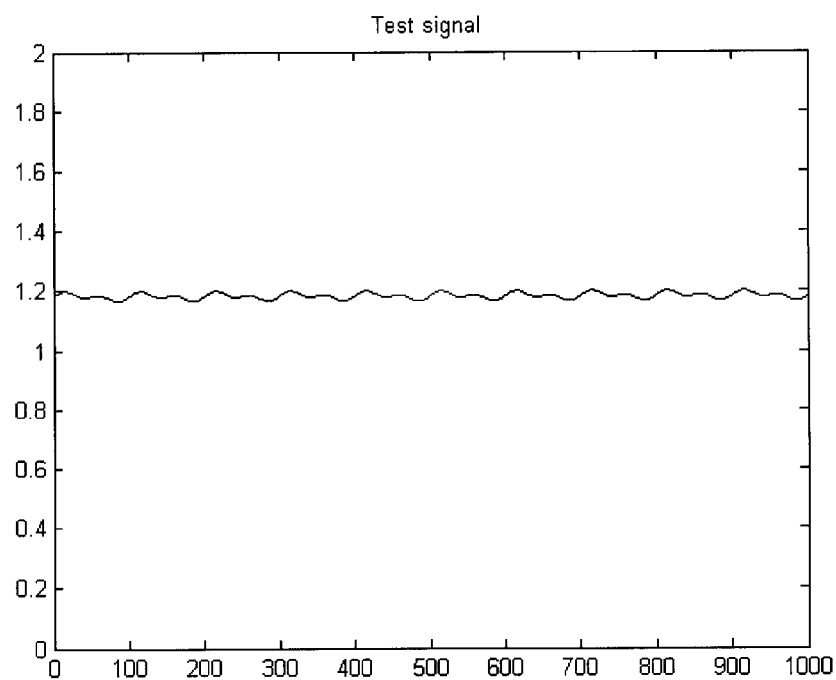
FIG. 10A illustrates a second test signal used to evaluate the functionality of the feed-forward dc-offset canceller, where the down-converted signal has a stronger dc-offset than the first test signal.
Figure 10B:
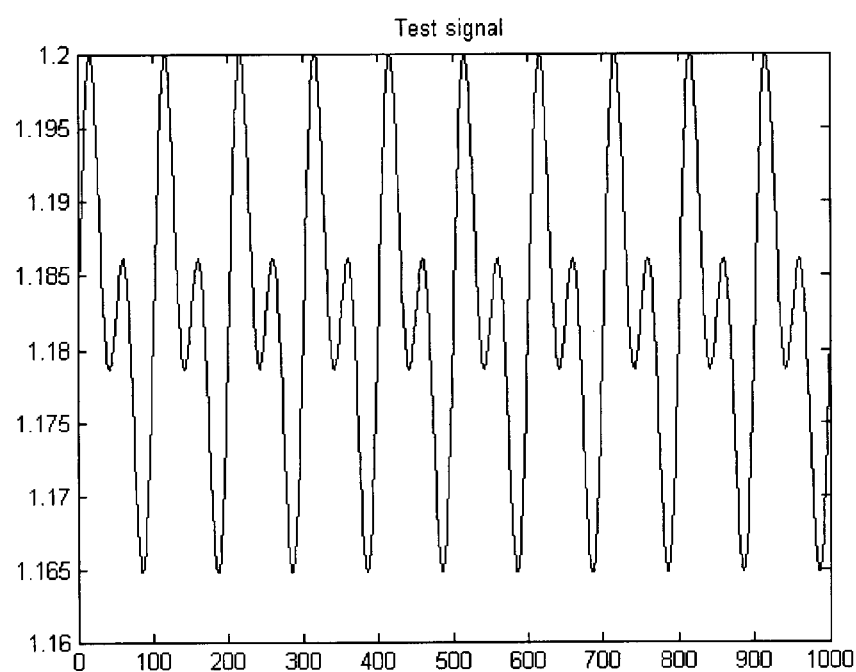
FIG. 10B illustrates the second test signal shown in FIG. 10A, with the voltage scale adjusted to magnify the down-converted signal.
Figure 11A:
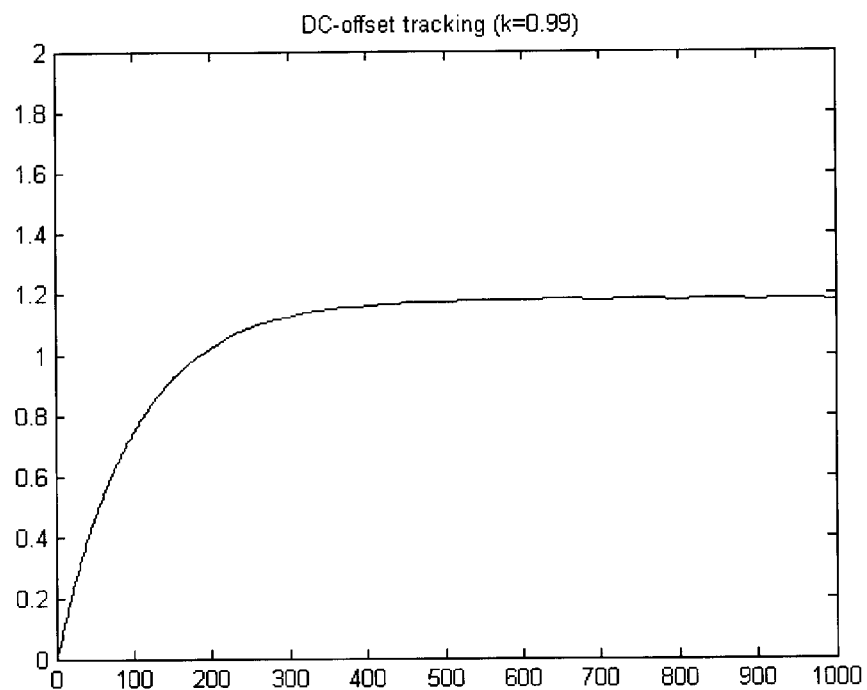
FIG. 11A illustrates the output of the dc-offset cancellation unit for a loop gain of 0.99, when the second test signal is fed into the feed-forward dc-offset canceller.
Figure 11B:
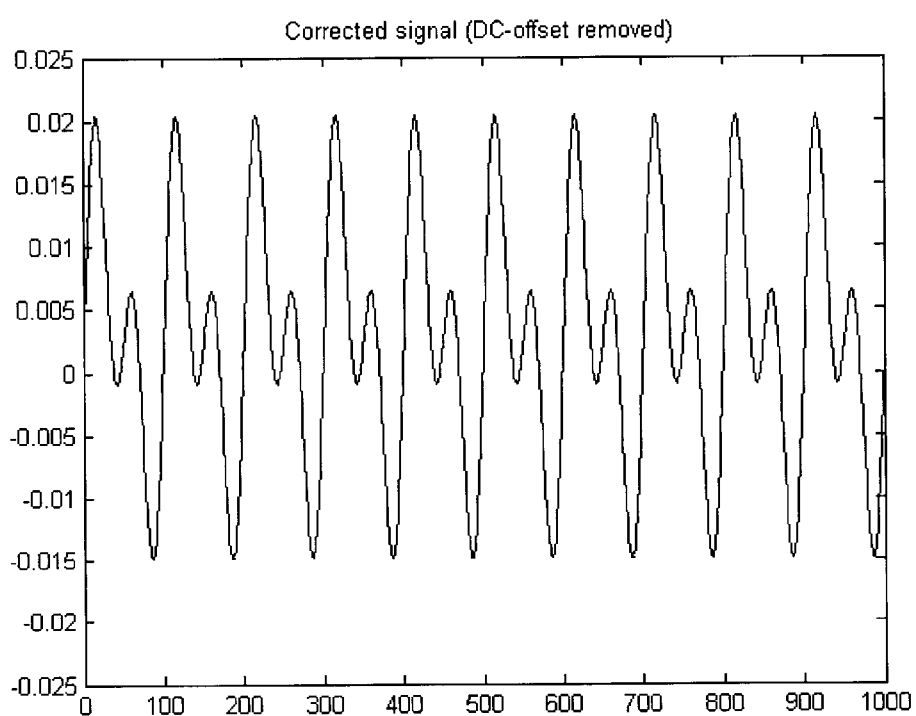
FIG. 11B illustrates the corrected signal at the input of the analog baseband section, applying the output of the dc-offset cancellation unit illustrated in FIG. 11A.
Figure 12A:
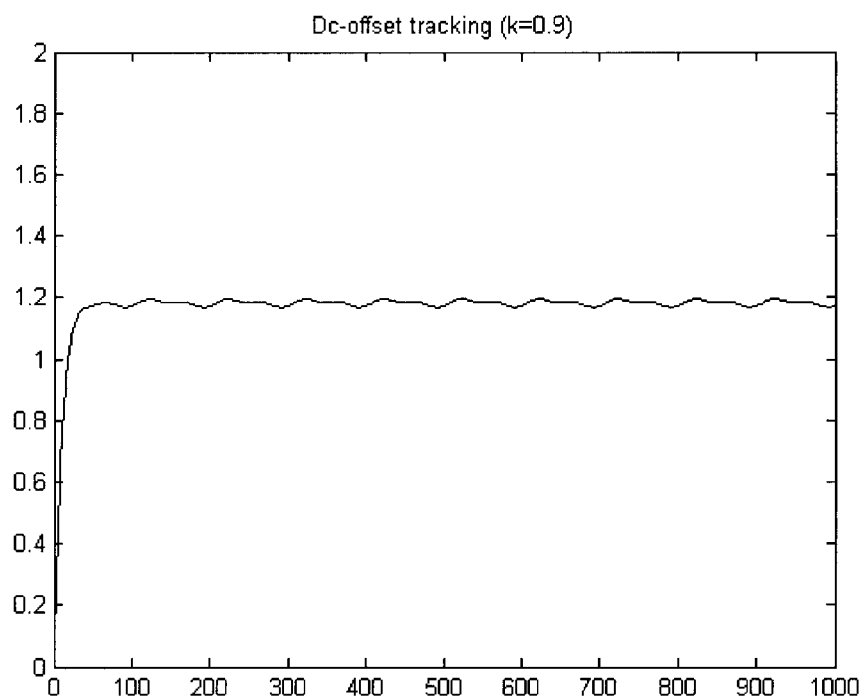
FIG. 12A illustrates the output of the dc-offset cancellation unit for a loop gain of 0.9, when the second test signal is fed into the feed-forward dc-offset canceller.
Figure 12B:
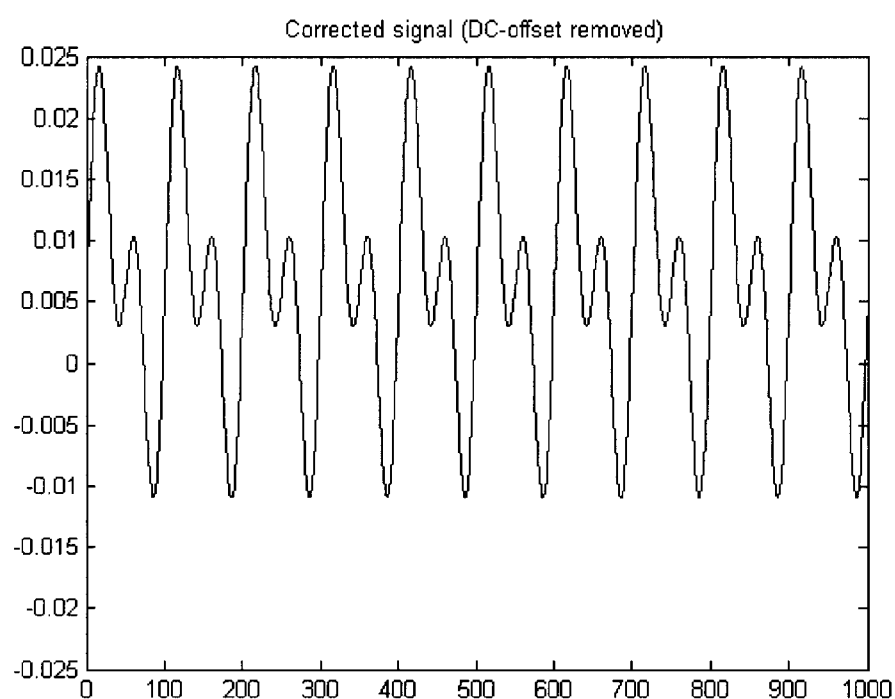
FIG. 12B illustrates the corrected signal at the input of the analog baseband section, applying the output of the dc-offset cancellation unit illustrated in FIG. 11A.

The simulation results prove the good performance and robustness of this invention, and the response time can adaptively be adjusted depending on the system requirements. Furthermore, the settling times, as observed in FIGS. 9A, 10A, and 11A, are for a start-up case, and after an initial estimate, the dc-offset estimation and tracking block 44 locks onto the dc-offset value and continuously tracks it.

Figure 13:
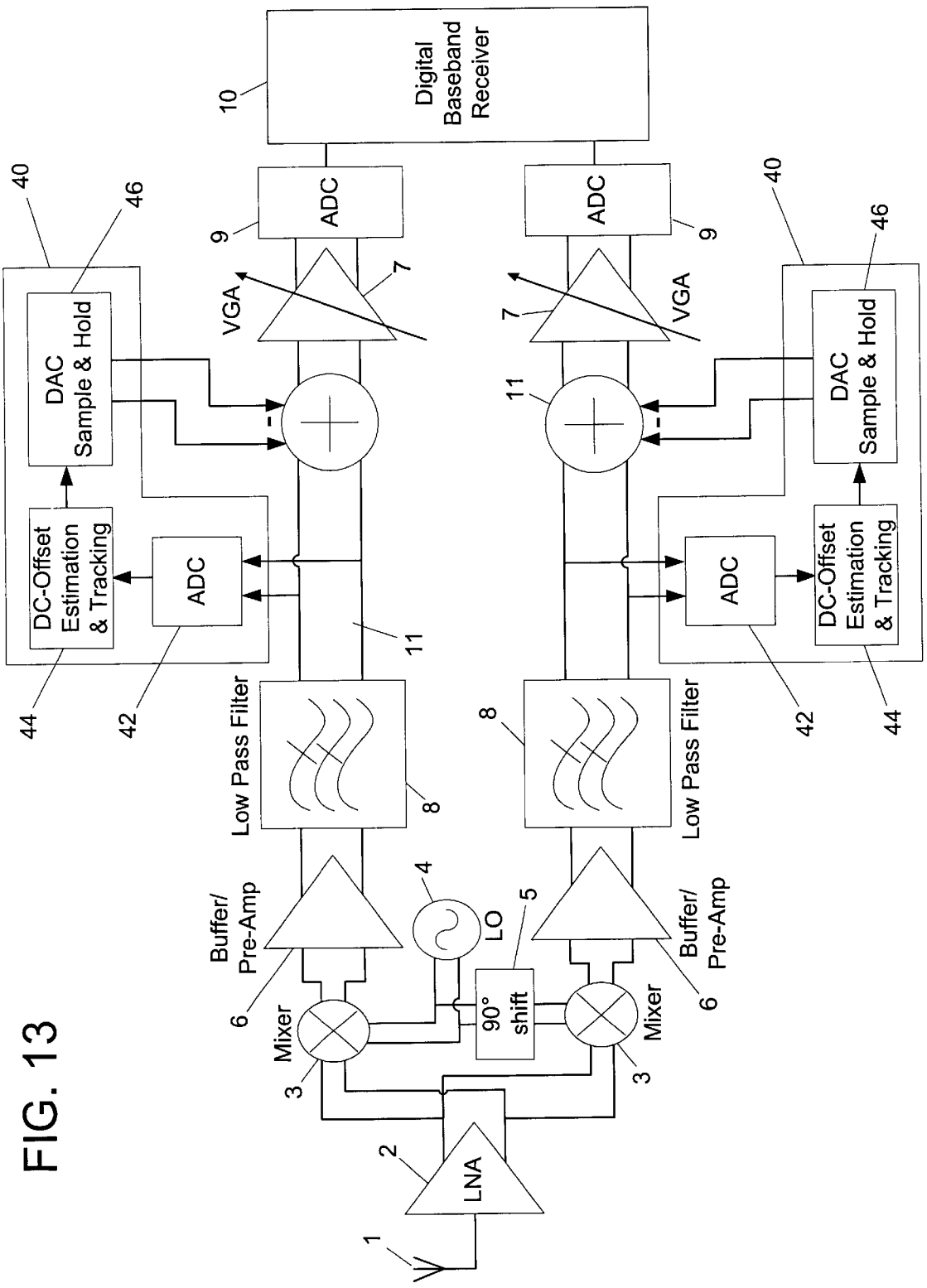
FIG. 13 illustrates a DCR architecture of a further embodiment of the invention.
Figure 14:
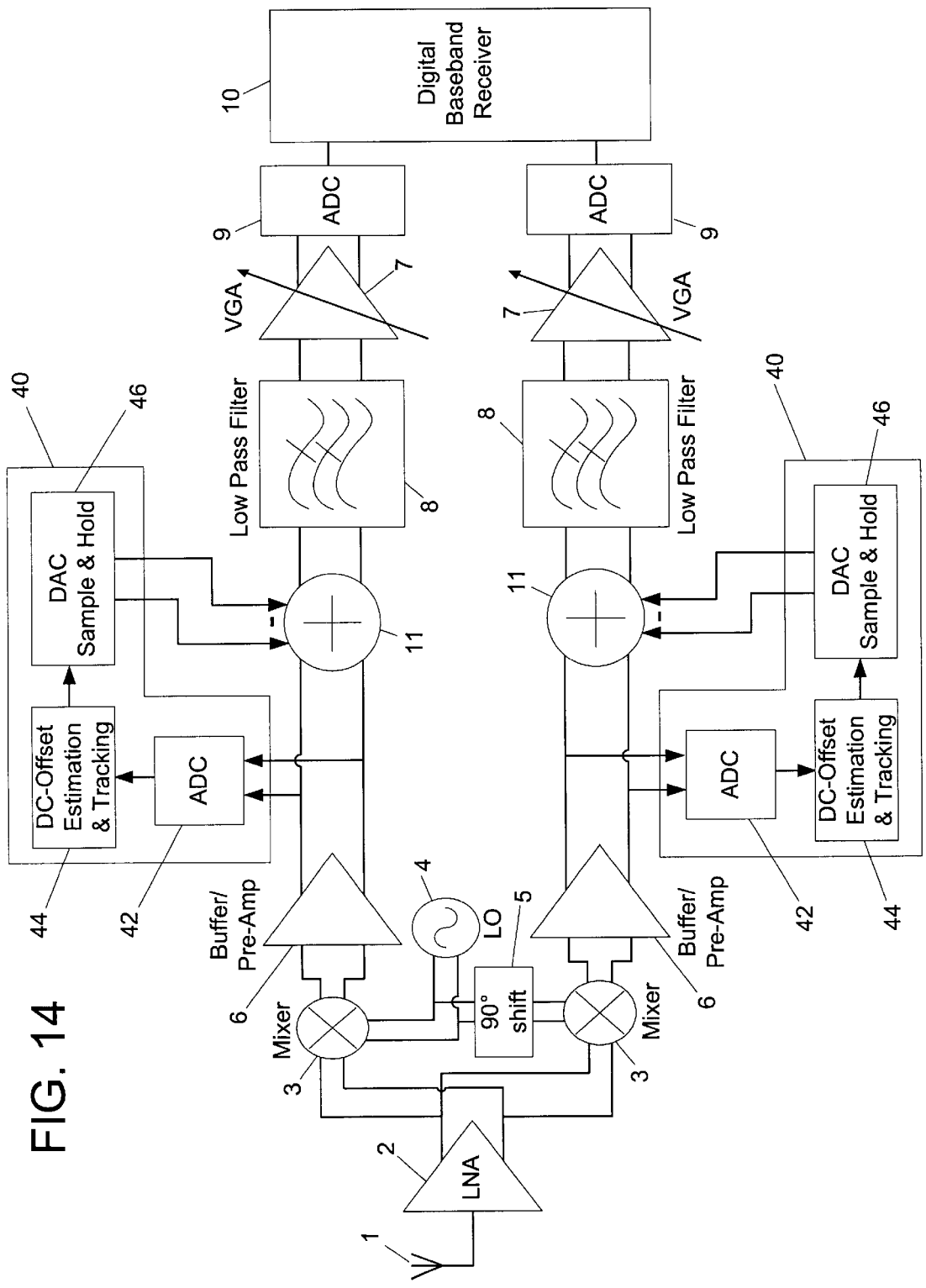
FIG. 14 illustrates a DCR architecture of yet a further embodiment of the invention.
Figure 15:
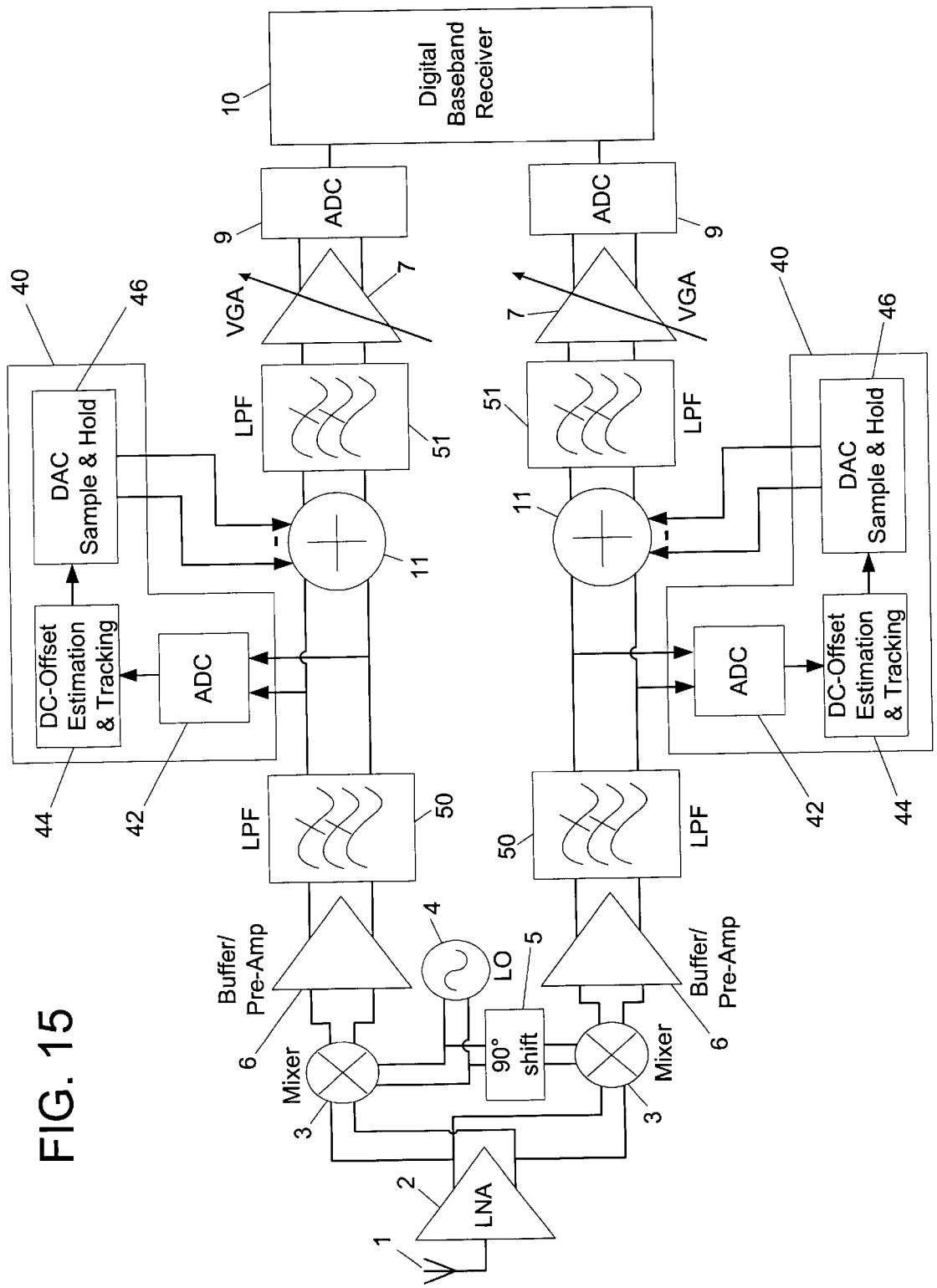
FIG. 15 illustrates a DCR architecture of still yet a further embodiment of the invention.

The exact order of the elements of the DCR is not essential, so long as dc-offset is cancelled in the analog baseband section. For example, in FIG. 3, the output of the feed-forward dc-offset canceller is applied to the input automatic gain control (AGC) circuit of the analog baseband section (i.e., variable gain amplifier 7), and the output of the AGC is applied to the low pass filter 8. However, as illustrated in FIG. 13, low pass filtering may be performed before the dc-offset is cancelled. Similarly, as illustrated in FIG. 14, low pass filtering may be performed after the dc-offset is cancelled, or as illustrated in FIG. 15, low pass filtering may be done both before and after dc-offset cancellation.

In the later case (FIG. 15), the filtering is split between low pass filters 50 and 51, and the first low pass filter 50 can have multiple functionalities, such as anti-aliasing filtering for the dc-offset canceller and blocking/channel selection filtering.

Figure 16:
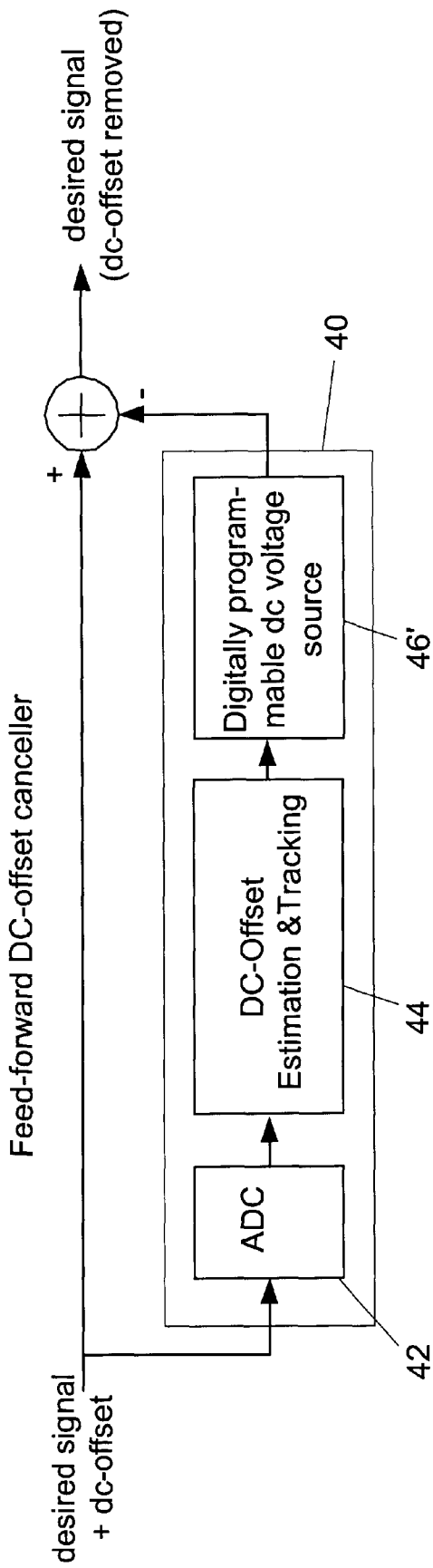
FIG. 16 is a block diagram of a feed-forward dc-offset canceller, in which, instead of a DAC, a digitally programmable dc voltage source is used.

Further, regarding all of the disclosed embodiments, a digitally programmable dc voltage source 46' may be used instead of a DAC 46, as illustrated in FIG. 16.

Figure 17:
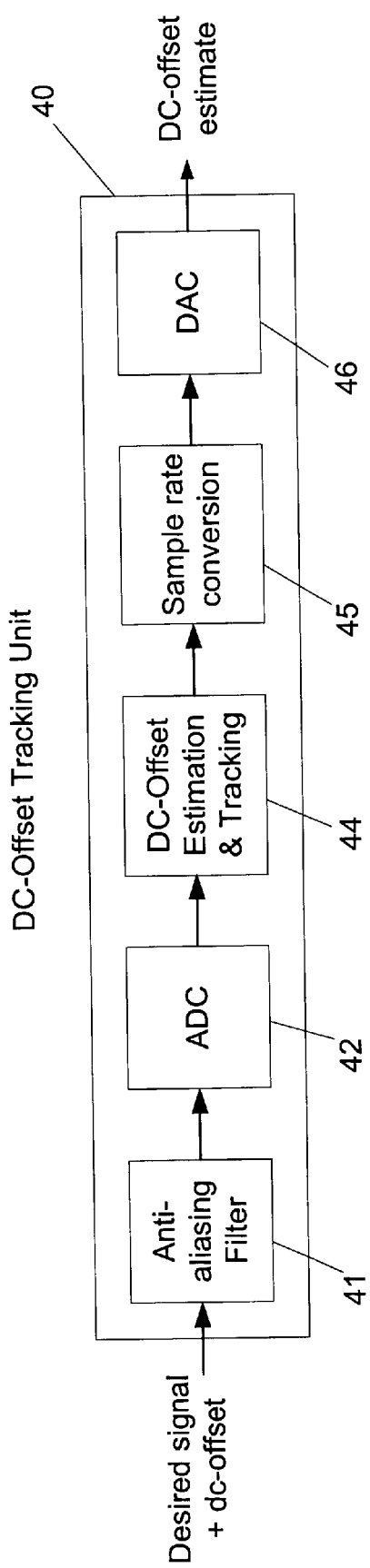
FIG. 17 illustrates an alternative DC-offset tracking unit for use with the various embodiments, which optionally includes an anti-aliasing filter and a sample rate conversion circuit.

Also, as illustrated in FIG. 17, an anti-aliasing filter 41 is optionally utilized. The bandwidth of the anti-aliasing filter can be variable or adaptive.

Also, the ADC 42 can use either a variable or a fixed sampling rate for analog-to-digital conversion.

Also, a sampling rate conversion circuit 45 is optionally utilized to adjust the data rate between the dc-offset estimation and tracking block 44 and the DAC 46 or digitally programmable dc voltage source 46'.

Also, DAC 46 can either continuously sample or use sample-and-hold.

The disclosed techniques have an accurate and a fast response due to the feed-forward structure. The requirements on the baseband amplifiers 7 and the ADCs 9 are more relaxed because the dc-offset noise does not go through the analog baseband section. Also with proper configuration, spectrum distortion is prevented, for those wireless standards where spectrum distortion is a problem. The complexity of this method is very low, which is an important issue in making a fully integrated receiver front-end.

The feed-forward structure has a faster response time than that of a feedback loop. In feedback-based methods, the weak desired signal plus the strong dc-offset go through the entire analog baseband section, which saturates both the baseband amplifiers and ADCs. Thereafter, the dc-offset cancellation circuit 30 estimates the offset noise (e.g., by averaging) from the signal-plus-dc-offset samples. After obtaining an estimate of the dc-offset, it is fed back to the mixer output to be subtracted from the signal. All this processing is slow and inefficient compared to the disclosed feed-forward techniques.

Generally, due to strong offset noise, and saturated analog baseband and ADCs, the initial estimate in feedback-based methods is poor, and after the initial estimate, it takes even longer time to catch up when tracking the offset value. Tracking is difficult, and the feedback loop may lose lock on the dc-offset.

The feed-forward structure does not suffer from these problems. In the feed-forward structure, a signal is sampled that comprises a strong dc component and a weak ac signal, so a low resolution ADC 42 in the dc-offset tracking unit 40 is sufficient, and even a better choice because there is no need to resolve the ac component in dc-offset tracking unit 40. Further, since typically the dc-offset varies very slowly, compared to the received signal, a low sampling-rate ADC 42 in the dc-offset tracking unit 40 provides satisfactory results. Preferably, the dc-offset is filtered out as much as possible.

As the offset noise is removed prior the analog baseband section, only the desired signal and possibly a negligible offset noise go through the baseband section and ADCs. Therefore the requirement on the baseband amplifiers 7 and ADCs 9 are not as stringent as they are in feedback-based methods, and specifically lower resolution ADCs 9 can be used. This is a vital issue for Wideband CDMA systems, since the signal is wideband, such that high-sampling-rate ADCs 9 should be used to sample the desired signal (e.g., twice chip rate is considered a low sampling rate). As there is always a trade off between sampling rate and resolution, the compromise between of high sampling-rate and high-resolution ADCs is minimized. Thus, it is much easier and more cost effective to use low resolution ADCs 9.

The principles of the present invention can be used with various wireless standards, such as GSM, PDC, 3G/WCDMA, and 4G, and are especially suited to multimode/multi-standard solutions.

It is contemplated that numerous modifications may be made to the embodiments and implementations of the present invention without departing from the spirit and scope of the invention as defined in the following claims.

What is claimed is:

1. A direct conversion receiver utilizing feed-forward dc-offset cancellation, comprising:
   a dc-offset tracking unit, sampling a down-converted signal, and outputting a dc-offset signal based upon the dc-offset in the sampled down-converted signal, said dc-offset tracking unit comprising a linear digital filter, estimating and tracking dc-offset in the sampled down-converted signal;
   a subtraction circuit, receiving the down-converted signal after the down-converted signal is sampled by the dc-offset tracking unit, and subtracting the dc-offset signal from the received down-converted signal; and
   an analog baseband circuit, comprising a variable gain amplifier, receiving the down-converted signal after the dc-offset is subtracted, and adjusting a gain of the signal.

2. A direct conversion receiver according to claim 1, further comprising:
   a mixer, receiving an RF signal, down-converting the RF signal to a zero intermediate frequency, and outputting the down-converted signal;
   an analog-to-digital converter, receiving the down-converted signal after the dc-offset is subtracted by said subtraction circuit and after the gain is adjusted by said analog baseband circuit, and converting the down-converted signal to digital for processing by a digital baseband receiver;
   a low pass filter, filtering the down-converted signal after the down-converted signal is output by said mixer, but before the down-converted signal is converted to digital by said analog-to-digital converter; and
   said digital baseband receiver, processing the digital signal.

3. A direct conversion receiver according to claim 2, said dc-offset offset tracking unit further comprising:
   an analog-to-digital circuit, comprising an analog-to-digital converter sampling the down-converted signal; and
   a digital-to-analog circuit, comprising a digital-to-analog converter or a digitally programmable dc-voltage source, outputting the dc-offset signal,
   wherein said linear digital filter is connected between said analog-to-digital circuit and said digital-to-analog circuit.

4. A direct conversion receiver according to claim 3, said dc-offset tracking unit further comprising a sampling rate converter, connected between said linear digital filter and said digital-to-analog circuit.

5. A direct conversion receiver according to claim 3, said direct conversion receiver further comprising an anti-aliasing filter, filtering the down-converted signal prior to said analog-to-digital circuit of said dc-offset tracking unit.

6. A direct conversion receiver according to claim 2, further comprising another low pass filter, filtering the down-converted signal after the down-converted signal is output by said mixer, but before the down-converted signal is converted to digital by said analog-to-digital converter, low pass filters being both before and after said subtraction circuit.

7. A direct conversion receiver according to claim 1, wherein said linear digital filter is an N-order digital filter having a transfer function:

$$y[n] - \sum_{l=1}^{N} a_l y[n-l] = \sum_{l=0}^{N} b_l x[n-l]$$

$$H(z) = \frac{\sum_{l=0}^{N} b_l z^{-l}}{1 - \sum_{l=1}^{N} a_l z^{-l}}$$

and at least one of $a_N$ and $b_N$ coefficients are not equal to zero.

8. A direct conversion receiver according to claim 7, further comprising:
   a mixer, receiving an RF signal, down-converting the RF signal to a zero intermediate frequency, and outputting the down-converted signal;
   an analog-to-digital converter, receiving the down-converted signal after the dc-offset is subtracted by said subtraction circuit and after the gain is adjusted by said analog baseband circuit, and converting the down-converted signal to digital for processing by a digital baseband receiver;

a low pass filter, filtering the down-converted signal after the down-converted signal is output by said mixer, but before the down-converted signal is converted to digital by said analog-to-digital converter; and said digital baseband receiver, processing the digital signal.

9. A direct conversion receiver according to claim 8, said dc-offset offset tracking unit further comprising:

an analog-to-digital circuit, comprising an analog-to-digital converter sampling the down-converted signal; and a digital-to-analog circuit, comprising a digital-to-analog converter or a digitally programmable dc-voltage source, outputting the dc-offset signal, wherein said linear digital filter is connected between said analog-to-digital circuit and said digital-to-analog circuit.

10. A direct conversion receiver according to claim 9, said dc-offset tracking unit further comprising a sampling rate converter, connected between said linear digital filter and said digital-to-analog circuit.

11. A direct conversion receiver according to claim 9, said direct conversion receiver further comprising an anti-aliasing filter, filtering the down-converted signal prior to said analog-to-digital circuit of said dc-offset tracking unit.

12. A direct conversion receiver according to claim 8, further comprising another low pass filter, filtering the down-converted signal after the down-converted signal is output by said mixer, but before the down-converted signal is converted to digital by said analog-to-digital converter, low pass filters being both before and after said subtraction circuit.

13. A direct conversion receiver according to 7, wherein at least one of $a_l$ and $b_l$ are adjusted adaptively.

14. A direct conversion receiver according to 13, wherein both of $a_l$ and $b_l$ are adjusted adaptively.

15. A direct conversion receiver according to claim 7, said dc-offset tracking unit further comprising:

an analog-to-digital circuit, comprising an analog-to-digital converter sampling the down-converted signal; and a digital-to-analog circuit, comprising a digital-to-analog converter or a digitally programmable dc-voltage source, outputting the dc-offset signal, wherein said linear digital filter is connected between said analog-to-digital circuit and said digital-to-analog circuit.

16. A direct conversion receiver according to claim 15, said dc-offset tracking unit further comprising a sampling rate converter, connected between said linear digital filter and said digital-to-analog circuit.

17. A direct conversion receiver according to claim 15, said direct conversion receiver further comprising an anti-aliasing filter, filtering the down-converted signal prior to said analog-to-digital circuit of said dc-offset tracking unit.

18. A direct conversion receiver according to 7, wherein both of $a_l$ and $b_l$ are fixed.

19. A direct conversion receiver according to 7, wherein said linear digital filter is an infinite impulse response filter, at least one $a_l$ not being zero for l=1 to N.

20. A direct conversion receiver according to 7, wherein said linear digital filter is a finite impulse response filter, wherein $a_l$=0 for l=1 to N.

21. A direct conversion receiver according to claim 1, wherein said linear digital filter is a first order recursive filter, having a transfer function:

$$y[n] = x[n] + ky[n-1]$$

$$y[n] - ky[n-1] = x[n]$$

$$H(z) = \frac{Y(z)}{X(z)} = \frac{1}{1 - kz^{-1}}$$

wherein k is a loop gain of the first order recursive filter.

22. A direct conversion receiver according to claim 21, further comprising:

a mixer, receiving an RF signal, down-converting the RF signal to a zero intermediate frequency, and outputting the down-converted signal;

an analog-to-digital converter, receiving the down-converted signal after the dc-offset is subtracted by said subtraction circuit and after the gain is adjusted by said analog baseband circuit, and converting the down-converted signal to digital for processing by a digital baseband receiver;

a low pass filter, filtering the down-converted signal after the down-converted signal is output by said mixer, before the down-converted signal is converted to digital by said analog-to-digital converter; and said digital baseband receiver, processing the digital signal.

23. A direct conversion receiver according to claim 22, said dc-offset tracking unit further comprising:

an analog-to-digital circuit, comprising an analog-to-digital converter sampling the down-converted signal; and a digital-to-analog circuit, comprising a digital-to-analog converter or a digitally programmable dc-voltage source, outputting the dc-offset signal, wherein said first order recursive filter is connected between said analog-to-digital circuit and said digital-to-analog circuit.

24. A direct conversion receiver according to claim 23, said dc-offset tracking unit further comprising a sampling rate converter, connected between said first order recursive filter and said digital-to-analog circuit.

25. A direct conversion receiver according to claim 23, said direct conversion receiver further comprising an anti-aliasing filter, filtering the down-converted signal prior to said analog-to-digital circuit of said dc-offset tracking unit.

26. A direct conversion receiver according to claim 22, further comprising another low pass filter, filtering the down-converted signal after the down-converted signal is output by said mixer, but before the down-converted signal is converted to digital by said analog-to-digital converter, low pass filters being both before and after said subtraction circuit.

27. A direct conversion receiver according to claim 21, said dc-offset tracking unit further comprising:

an analog-to-digital circuit, comprising an analog-to-digital converter sampling the down-converted signal; and a digital-to-analog circuit, comprising a digital-to-analog converter or a digitally programmable dc-voltage source, outputting the dc-offset signal, wherein said first order recursive filter is connected between said analog-to-digital circuit and said digital-to-analog circuit.

28. A direct conversion receiver according to claim 27, said dc-offset tracking unit further comprising a sampling rate converter, connected between said first order recursive filter and said digital-to-analog circuit.

29. A direct conversion receiver according to claim 27, said direct conversion receiver further comprising an anti-aliasing filter, filtering the down-converted signal prior to said analog-to-digital circuit of said dc-offset tracking unit.

30. A direct conversion receiver according to claim 1, said dc-offset tracking unit further comprising:
- an analog-to-digital circuit, comprising an analog-to-digital converter sampling the down-converted signal; and
- a digital-to-analog circuit, comprising a digital-to-analog converter or a digitally programmable dc-voltage source, outputting the dc-offset signal,
- wherein said linear digital filter is connected between said analog-to-digital circuit and said digital-to-analog circuit.

31. A direct conversion receiver according to claim 30, said dc-offset tracking unit further comprising a sampling rate converter, connected between said linear digital filter and said digital-to-analog circuit.

32. A direct conversion receiver according to claim 30, said direct conversion receiver further comprising an anti-aliasing filter, filtering the down-converted signal prior to said analog-to-digital circuit of said dc-offset tracking unit.

33. A direct conversion receiver according to claim 1, wherein said linear digital filter is an infinite impulse response filter.

34. A direct conversion receiver according to claim 1, wherein said linear digital filter is a finite impulse response filter.

35. A feed-forward method of canceling dc-offset from a signal in a circuit, comprising:
- monitoring the signal;
- detecting the dc-offset in the monitored signal by applying a linear filtering function; and
- subtracting the detected dc-offset from the signal at a point in the circuit after where the signal was monitored.

36. A method according to claim 35, wherein said linear filtering function is an N-order function having a transfer function of:

$$y[n] - \sum_{l=1}^{N} a_l y[n-l] = \sum_{l=0}^{N} b_l x[n-l]$$

$$H(z) = \frac{\sum_{l=0}^{N} b_l z^{-l}}{1 - \sum_{l=1}^{N} a_l z^{-l}}$$

with at least one of $a_N$ and $b_N$ coefficients not being equal to zero.

37. A method according to 36, wherein at least one of $a_l$ and $b_l$ are adjusted adaptively.

38. A method according to 37, wherein both of $a_l$ and $b_l$ are adjusted adaptively.

39. A method according to 36, wherein both $a_l$ and $b_l$ are fixed.

40. A method according to 36, wherein said linear filtering function is an infinite impulse response function, at least one $a_l$ not being zero for l=1 to N.

41. A method according to 36, wherein the linear filtering function is a finite impulse response function, wherein $a_l$=0 for l=1 to N.

42. A method according to claim 35, wherein the linear filtering function is a first order recursive function, having a transfer function of:

$$y[n] = x[n] + ky[n-1]$$

$$y[n] - ky[n-1] = x[n]$$

$$H(z) = \frac{Y(z)}{X(z)} = \frac{1}{1 - kz^{-1}}$$

wherein k is a loop gain of the first order recursive function.

43. A method according to claim 35, wherein said linear filtering function is an infinite impulse response function.

44. A method according to claim 35, wherein said linear filtering function is a finite impulse response function.

45. A method operating a direct conversion receiver, comprising:
- receiving an RF signal;
- down-converting the RF signal to a zero intermediate frequency by mixing the RF signal with a signal from a local oscillator;
- canceling a dc-offset in the down-converted signal, comprising:
  - monitoring the down-converted signal,
  - detecting the dc-offset in the monitored signal by applying a linear filtering function, and
  - subtracting the detected dc-offset from the down-converted signal at a point in the direct conversion receiver after where the down-converted signal was monitored;
- adjusting gain of the down-converted signal after the dc-offset is cancelled;
- converting the down-converted signal from analog to digital after the gain is adjusted;
- low pass filtering the down-converted signal, in-between down-converting the RF signal and converting the down-converted signal from analog to digital; and
- processing the digitally-converted signal.

46. A method according to claim 45, wherein said linear filtering function is an N-order function having a transfer function of:

$$y[n] - \sum_{l=1}^{N} a_l y[n-l] = \sum_{l=0}^{N} b_l x[n-l]$$

$$H(z) = \frac{\sum_{l=0}^{N} b_l z^{-l}}{1 - \sum_{l=1}^{N} a_l z^{-l}}$$

with at least one of $a_N$ and $b_N$ coefficients not being equal to zero.

47. A method according to 46, wherein at least one of $a_l$ and $b_l$ are adjusted adaptively.

48. A method according to 47, wherein both of $a_l$ and $b_l$ are adjusted adaptively.

49. A method according to claim 46, wherein detecting the dc-offset further comprises:
- converting the monitored signal from analog to digital before applying said linear filtering function; and
- converting a result from said linear filtering function from digital to analog,
- wherein the linear filtering function is applied digitally.

50. A method according to claim 49, wherein converting the result from digital to analog includes adjusting a digital sampling rate.

51. A method according to claim 49, further comprising applying an anti-alias filtering function to the down-converted signal prior to converting the monitored signal from analog to digital.

52. A method according to 46, wherein both $a_l$ and $b_l$ are fixed.

53. A method according to 46, wherein said linear filtering function is an infinite impulse response function, at least one $a_l$ not being zero for l=1 to N.

54. A method according to 46, wherein the linear filtering function is a finite impulse response function, wherein $a_l$=0 for l=1 to N.

55. A method according to claim 45, wherein the linear filtering function is a first order recursive function, having a transfer function of:

$$y[n] = x[n] + ky[n-1]$$
$$y[n] - ky[n-1] = x[n]$$
$$H(z) = \frac{Y(z)}{X(z)} = \frac{1}{1 - kz^{-1}}$$

wherein k is a loop gain of the first order recursive function.

56. A method according to claim 55, wherein detecting the dc-offset further comprises:
   converting the monitored signal from analog to digital before applying the first order recursive filtering function; and
   converting a result from the first order recursive filtering function from digital to analog,
   wherein the first order recursive filtering function is applied digitally.

57. A method according to claim 56, wherein converting the result from digital to analog includes adjusting a digital sampling rate.

58. A method according to claim 56, further comprising applying an anti-alias filtering function to the down-converted signal prior to converting the monitored signal from analog to digital.

59. A method according to claim 45, wherein detecting the dc-offset further comprises:
   converting the monitored signal from analog to digital before applying said linear filtering function; and
   converting a result from said linear filtering function from digital to analog,
   wherein the linear filtering function is applied digitally.

60. A method according to claim 59, wherein converting the result from digital to analog includes adjusting a digital sampling rate.

61. A method according to claim 59, further comprising applying an anti-alias filtering function to the down-converted signal prior to converting the monitored signal from analog to digital.

62. A method according to claim 45, wherein said linear filtering function is an infinite impulse response function.

63. A method according to claim 45, wherein said linear filtering function is a finite impulse response function.

* * * * *